United States Patent
Hachiya et al.

(10) Patent No.: US 7,221,090 B2
(45) Date of Patent: May 22, 2007

(54) BLUE ORGANIC ELECTROLUMINESCENT DEVICE AND DISPLAY USING SAME

(75) Inventors: Satoshi Hachiya, Sodegaura (JP); Hitoshi Kuma, Sodegaura (JP); Chishio Hosokawa, Sodegaura (JP); Kenichi Fukuoka, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 22 days.

(21) Appl. No.: 11/257,147

(22) Filed: Oct. 25, 2005

(65) Prior Publication Data

US 2006/0232196 A1 Oct. 19, 2006

Related U.S. Application Data

(63) Continuation of application No. PCT/JP05/08349, filed on May 6, 2005.

(30) Foreign Application Priority Data

May 18, 2004 (JP) ............................... 2004-147166

(51) Int. Cl.
*H05B 33/00* (2006.01)
(52) U.S. Cl. ...................... 313/504; 313/506
(58) Field of Classification Search ................ 313/498, 313/501, 503, 504, 506
See application file for complete search history.

(56) References Cited

U.S. PATENT DOCUMENTS 5,949,187 A 9/1999 Xu et al.

FOREIGN PATENT DOCUMENTS

| JP | 06-275381 | 9/1994 |
|----|-----------|--------|
| JP | 07-142171 | 6/1995 |
| JP | 08/008061 | 1/1996 |
| JP | 2004-099464 | 4/2004 |
| WO | WO 01/39554 A1 | 5/2001 |

*Primary Examiner*—Vip Patel
(74) *Attorney, Agent, or Firm*—Steptoe & Johnson LLP

(57) ABSTRACT

A blue organic electroluminescent device including a first reflective member (21), a second reflective member (23) and an emitting layer (22) arranged between the first and the second reflective members (21), (23); wherein the emitting layer comprises a first organic luminescent medium emitting light with a blue first peak wavelength and a second medium emitting light with a second peak wavelength; each of lights emitted from the first and second organic luminescent mediums are interfered with between the first and second reflective members (21), (23) to enhance light emitted from the first organic luminescent medium; and light taken out to outside has a first peak wavelength and a second peak wavelength that satisfy the following relationship:

$$I1 > I2 \times 5,\ I1 < I2 \times 100$$

wherein I1 is a luminous intensity at the first peak wavelength and I2 is a luminous intensity at the second peak wavelength.

15 Claims, 4 Drawing Sheets

BLUE ORGANIC ELECTROLUMINESCENT DEVICE AND DISPLAY USING SAME

TECHNICAL FIELD

The invention relates to a blue organic electroluminescent (EL) device and a display using the same.

An EL device utilizing electroluminescence exhibits excellent visibility because the EL device is a self-luminous device, and exhibits excellent impact resistance because the EL device is a completely solid-state device. Therefore, the EL device has attracted attention as a light emitting device for various displays.

An organic EL device has an "anode/emitting layer/cathode" basic configuration. When an electric field is applied between the electrodes, electrons are injected from the cathode and holes are injected from the anode. The electrons and the holes recombine in the emitting layer to create an excited state, and the energy is emitted as light when the energy state transits from the excited state to the ground state.

The emitting layer generally contains a host material and a small amount of fluorescent molecules (dopants). The dopant efficiently receives the energy of the excited host to increase the luminous efficiency.

As an organic EL device which emits white light, a white EL device using two kinds of dopants of a blue dopant and a yellow to orange dopant has been known. Such a device has a long lifetime, but has a problem in which the efficiency is decreased by extracting the blue light component using a color filter.

On the other hand, attempts have been made to selectively extract blue emission by utilizing optical interference. In patent documents 1 and 2, for example, two reflecting members are arranged in pairs on either side of an emitting layer of an organic EL device, and lights emitted from the emitting layer are caused to interfere with between the reflecting members to enhance and extract blue emission alone.

However, since this method extracts only blue emission by utilizing strong resonance, the viewing angle properties are decreased.

Moreover, a blue EL device having a longer lifetime has been demanded.

[Patent document 1] JP-A-H08-8061

[Patent document 2] U.S. Pat. No. 5,949,187

An object of the invention is to provide a blue organic EL device having a long lifetime and exhibiting high efficiency and a display using the same.

DISCLOSURE OF THE INVENTION

As a result of extensive studies, the inventors of the invention found that the lifetime, efficiency, and viewing angle properties of an organic EL device can be improved by enhancing blue emission by combining an interference effect with an organic EL device including a first organic luminescent medium having an luminescent peak in the blue region and a second organic luminescent medium having an luminescent peak differing from the luminescent peak of the first organic luminescent medium and allowing the two luminescent peak wavelengths to have a specific relationship. This finding has led to the completion of the invention.

The invention provides the following blue organic EL device and a display using the same.

1. A blue organic electroluminescent device comprising:
   a first reflective member,
   a second reflective member and
   an emitting layer arranged between the first and the second reflective members;
   wherein the emitting layer comprises a first organic luminescent medium emitting light with a blue first peak wavelength and a second medium emitting light with a second peak wavelength;
   each of lights emitted from the first and second organic luminescent mediums are interfered with between the first and second reflective members to enhance the light emitted from the first organic luminescent medium; and
   light taken out to outside has a first peak wavelength and a second peak wavelength that satisfy the following relationship:

$$I1 > I2 \times 5,\ I1 < I2 \times 100$$

wherein I1 is a luminous intensity at the first peak wavelength and I2 is a luminous intensity at the second peak wavelength.

2. The blue organic electroluminescent device described in 1 wherein the first peak wavelength is ranged from 400 nm to 500 nm, and the second peak wavelength is ranged from 500 nm to 700 nm.

3. The blue organic electroluminescent device described in 1 or 2 wherein an energy gap Eg1 of the first organic luminescent medium and an energy gap Eg2 of the second organic luminescent medium satisfies the relationship of $Eg1 > Eg2$.

4. The blue organic electroluminescent device described in any one of 1 to 3 which satisfies the relationship represented by the following equation:

$$(2L)/\lambda + \Phi/(2\pi) = m$$

wherein L is the optical length between the first and the second reflective members, $\lambda$ is the blue first peak wavelength, $\Phi$ is the sum of phase shifts at the interfaces between the two reflective members, and m is an integer of 0 or more or a value around the integer.

5. The blue organic electroluminescent device described in any one of 1 to 4 wherein the emitting layer is a multi-layered structure of a first layer comprising the first organic luminescent medium and a second layer comprising the second organic luminescent medium.

6. An organic electroluminescent display comprising;
   the blue organic electroluminescent device described in any one of 1 to 5; and
   a color adjusting member that adjusts color of light emitted from the blue organic electroluminescent device.

7. An organic electroluminescent display comprising in sequence;
   a substrate;
   the blue organic electroluminescent device described in any one of 1 to 5; and
   a color adjusting member that adjusts color of light emitted from the blue organic electroluminescent device.

According to the invention, a blue organic EL device having a long lifetime and exhibiting high efficiency and a display using the same can be provided.

BEST MODE FOR CARRYING OUT THE INVENTION

The invention is described below with reference to the drawings.

Figure 1:
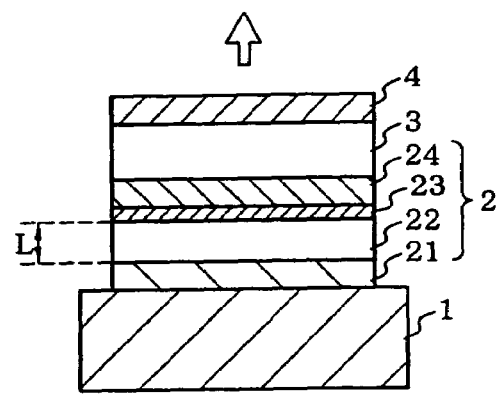
FIG. 1 is a diagram showing one embodiment of a blue organic EL display of the invention.

FIG. 1 is a diagram showing one embodiment of a blue organic EL display of the invention.

In this display, a blue organic EL device 2, a transparent protective layer 3, and a color adjusting layer 4 are formed on a substrate 1. The blue organic EL device 2 includes a reflective electrode 21 (serving as a first reflecting member and an electrode), an emitting layer 22, a metal layer 23 (second reflecting member), and a transparent electrode 24. The multi-layered structure of the metal layer 23 and the transparent electrode 24 function as a semitransparent electrode.

The reflective electrode 21 is a layer functioning as an electrode which supplies holes or electrons and reflecting light generated by the emitting layer 22 in the light emission direction indicated by the arrow. The reflective electrode preferably has an average reflectance of 65% or more at a wavelength of 400 to 700 nm.

The emitting layer 22 includes a first dopant (first organic luminescent medium) (not shown) which emits light having a blue first luminescent peak, and a second dopant (second organic luminescent medium) (not shown) which emits light having a second luminescent peak.

In general, a luminescent medium having a smaller energy gap tends to emit light having a longer wavelength. Therefore, in order to ensure that the second luminescent peak has a wavelength longer than the wavelength of the first luminescent peak, it is preferable that Eg1 be greater than Eg2 (Eg1 indicates the energy gap of the first organic luminescent medium, and Eg2 indicates the energy gap of the second organic luminescent medium).

The energy gap used herein corresponds to the difference in energy between the valence level and the conduction level of an organic EL material, and is generally determined from the absorption edge in the absorption spectrum of the material.

The multi-layered film of the metal layer 23 and the transparent electrode 24 functions as an electrode which supplies holes or electrons, and it reflects and transmits light generated by the emitting layer 22. The multi-layered film preferably has an average reflectance of 20 to 80% at a wavelength of 400 to 700 nm.

The reflective electrode 21 and the transparent electrode 24 each may be either an anode or a cathode. The electrode provided in the direction of taking out of light to outside exhibits optical transparency. The optically transparent electrode has a visible light transmittance of preferably 20% or more, and still more preferably 50% or more.

The transparent protective layer 3 is a layer which is arbitrarily provided in order to prevent deterioration of the organic EL device 2 due to oxygen, water, and other volatile components existed in the environment and the color adjusting layer 4. As specific examples of the transparent protective layer 3, a transparent inorganic compound layer including an inorganic compound such as $SiO_xN_y$, $AlO_xN_y$, or $SiAlO_xN_y$, a layer prepared by stacking the transparent inorganic compound layer and a transparent resin or a sealing liquid, and the like can be employed.

Figure 2:
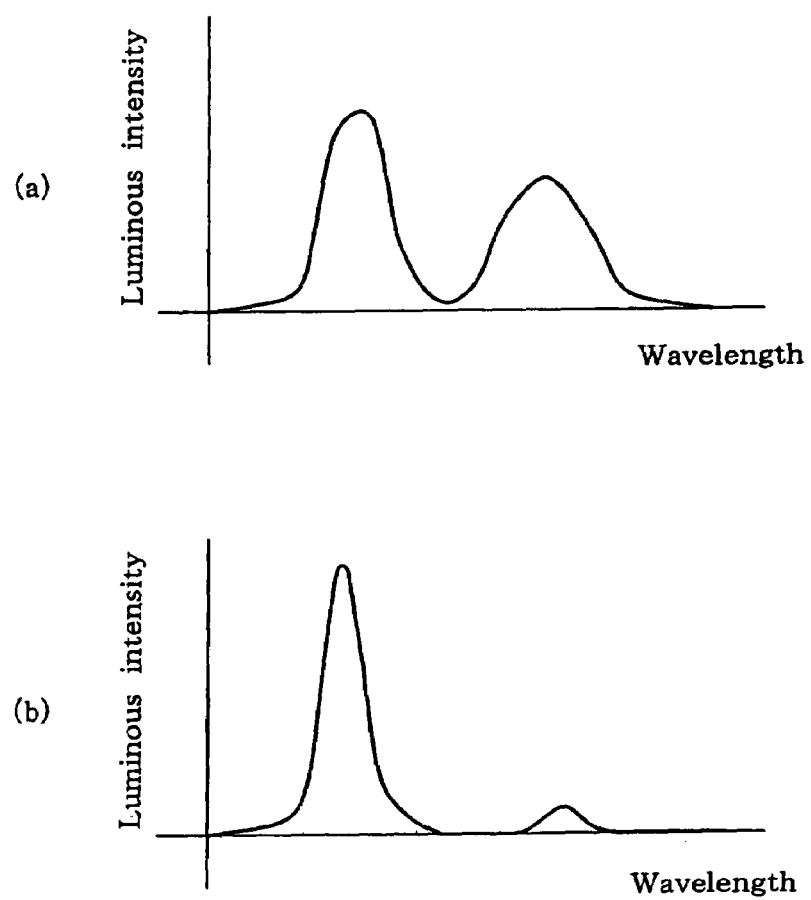
FIG. 2(a) is a diagram showing a wavelength spectrum of light emitted from an emitting layer before undergoing optical interference.
FIG. 2(b) is a diagram showing a wavelength spectrum of light emitted from the organic EL device after undergoing optical interference.

In this display, when voltage is applied between the electrodes 21 and 24, light having a blue wavelength peak and light having a second (e.g. green to red) wavelength peak shown in FIG. 2(a) are emitted from the emitting layer 22.

The organic EL device 2 has an optical resonator structure in which a resonator is formed between the reflective electrode 21 and the metal layer 23. The optical resonator structure allows light generated by the emitting layer 22 to be repeatedly reflected between two reflecting surfaces (reflective electrode 21 and metal layer 23) so that light having a wavelength in the vicinity of the wavelength satisfying the following equation (1) is selectively enhanced and emitted from the device.

$$(2L)/\lambda + \Phi/(2\pi) = m \tag{1}$$

wherein L is the optical length of the resonator, $\lambda$ is the wavelength of the light, $\Phi$ is the sum of phase shifts at the interface between the two reflecting members, and m is an integer of zero or more or a value near an integer.

The term "value near an integer" used herein means a value in the range across an integer in which a resonance effect is observed.

The optical length L is the product of the refractive index n and the actual geometrical length $L_R$ of the medium through which the light passes. In FIG. 1, L schematically indicates the optical length of the organic EL device 2.

The optical length L is calculated as follows.

Specifically, a thin film of the material by itself forming the emitting layer 22 is formed on a supporting substrate. The resulting thin film sample is subjected to optical measurement using an ellipsometer or the like to determine the refractive index n of the material. Then, the product of the thickness d of each layer when forming the organic EL device and the refractive index n is calculated, and the optical length L is determined by calculating the sum of the products.

The sum $\Phi$ of phase shifts is calculated as follows. The sum $\Phi$ of phase shifts is expressed by the following equation.

$$\Phi = \Phi_1 + \Phi_2 \tag{2}$$

$\Phi_1$ is calculated as follows. Specifically, the reflective electrode 21 is formed on a supporting substrate. The resulting thin film sample is subjected to optical measurement using an ellipsometer or the like to determine the refractive index $n_0$ and the extinction coefficient $k_0$ of the material. The amplitude reflectance r of light at the reflective electrode is calculated by the following equation (3). In the equation (3), $n_1$ is the refractive index of the material for the layer in contact with the reflective electrode 21 on the side of the reflecting member 23, and i is an imaginary unit.

$$r = \frac{n_1 - (n_0 - i\kappa_0)}{n_1 + (n_0 - i\kappa_0)} \quad (1)$$

The amplitude reflectance r is a complex number and is expressed as "r=a+i·b". In this case, $\Phi_1$ may be calculated by the following equation (4).

$$\Phi_1 = \arctan\left(\frac{2n_1\kappa_0}{n_1^2 - n_0^2 - \kappa_0^2}\right) \quad (2)$$

$\Phi_2$ is also calculated by the equation (4) after calculating the refractive index and the extinction coefficient of the reflecting member 23 and the refractive index of the material for the layer in contact with the reflecting member 23 on the side of the reflective electrode 21.

The optical length L may be adjusted by the refractive index and the thickness of one or more layers including at least the emitting layer present between the two reflecting surfaces. The optical length L may also be adjusted by providing an optical thickness adjusting layer such as an inorganic compound layer.

In the organic EL device 2 of the invention, since the blue wavelength is selected for the wavelength λ, light is emitted from the organic EL device 2 in a state in which the blue first peak wavelength is selectively enhanced and the second wavelength is weakened, as shown in FIG. 2(b).

In this case, the first and second peak wavelengths satisfy the following relationship.

$I1 > I2 \times 5$ (preferably $I2 \times 10$), and $I1 < I2 \times 100$ (preferably $I2 \times 70$)

wherein I1 is a luminous intensity at the first peak wavelength, and I2 is a luminous intensity at the second peak wavelength.

In this embodiment of the invention, the following measures are taken so that the second wavelength peak remains at a small extent due to not too strong resonance, specifically, the relationship "$I1 < I2 \times 100$" is satisfied.

1) Adjust the thickness ratio of the first luminescent medium to the second luminescent medium.

2) When the luminescent medium is a film made of a mixture of a host material and a luminescent dopant, adjust the dopant concentration in the first luminescent medium and the dopant concentration in the second luminescent medium.

3) Adjust the optical thickness between the first and second reflecting members so that the value "$(2L)/\lambda + \Phi/(2\pi)$" (L, λ, and Φ are the same as defined above) approaches zero.

The blue wavelength (first wavelength) is preferably from 400 to 500 nm, and the second wavelength is preferably from 500 to 700 nm or from 510 to 700 nm (green to red).

Light emitted from the device 2 is arbitrarily adjusted in color by the color adjusting member 4 and emitted to the outside. A device which emits light in a specific color can be obtained by providing a color filter in a specific color as the color adjusting layer. A full color display can be obtained by providing a green conversion member which converts blue light into green light and a red conversion member which converts blue light into red light as the color adjusting layers. In this case, the purity of each color can be increased by providing blue, green, and red color filters corresponding to the three primary colors. The device may be used as a blue light emitting device without providing the color adjusting layer.

In a conventional organic EL device which does not have the resonator as used in one embodiment of the invention, when using two kinds of dopants of a blue dopant and a green to red dopant, the organic EL device emits light in a color other than blue in ordinary circumstances. However, the organic EL device according to one embodiment of the invention substantially emits blue light by utilizing an interference effect. Moreover, blue emission can occur for a long time due to the presence of the green to red wavelength peak which affects the emission color to only a small extent.

In FIG. 1, only the emitting layer 22 is arranged between the electrodes 21 and 24 so as to make the invention to be readily understood. However, the organic EL device generally further includes an electron injecting layer, an electron transporting layer, a hole injecting layer, a hole transporting layer, and other layers, as described later.

In one embodiment of the invention, the metal layer 23 is arranged between the transparent electrode 24 and the emitting layer 22 as the second reflecting member. However, the metal layer 23 may reversely be stacked on the transparent electrode 24, or additional layers may be arranged between the metal layer 23 and the emitting layer 22. An insulating layer such as a dielectric multilayer film other than the metal layer may be used as the second reflecting member, as described later.

The first reflecting member need not be identical to the electrode. The first reflecting member and the electrode may be separated from each other and arranged in that sequence in the direction of taking out of light to outside, or an insulative reflecting layer and an electrode may be stacked in that sequence in the light emission direction. As a specific example of the insulative reflecting layer, a multi-layered film of a high-refractive-index dielectric layer and a low-refractive-index dielectric layer, which is known as a dielectric laser mirror can be given. As examples of the material for the high-refractive-index dielectric layer, metal oxides such as $ZrO_2$, $CeO_2$, and $Ta_2O_3$ and II–VI compounds such as ZnS and CdS can be given. As examples of the material for the low-refractive-index dielectric layer, metal fluorides such as $CaF_2$ and $AlF_3$ can be given.

Figure 3:
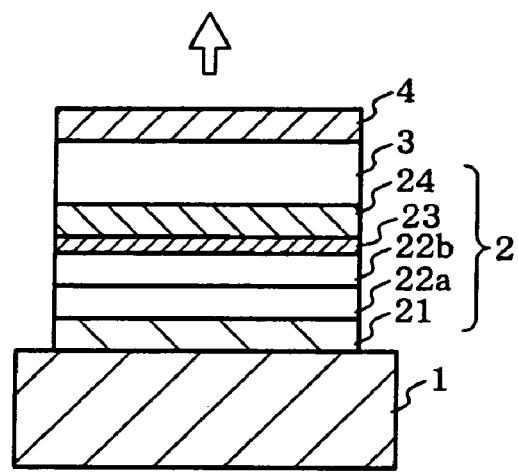
FIG. 3 is a diagram showing another embodiment of the blue organic EL display of the invention.

As shown in FIG. 3, the emitting layer 22 may be a multi-layered structure of a first layer 22a containing a first organic luminescent medium and a second layer 22b containing a second organic luminescent medium. In this case, it is preferable that the first layer 22a which emits blue light be positioned on the anode side in order to facilitate luminous intensity adjustment.

Figure 4:
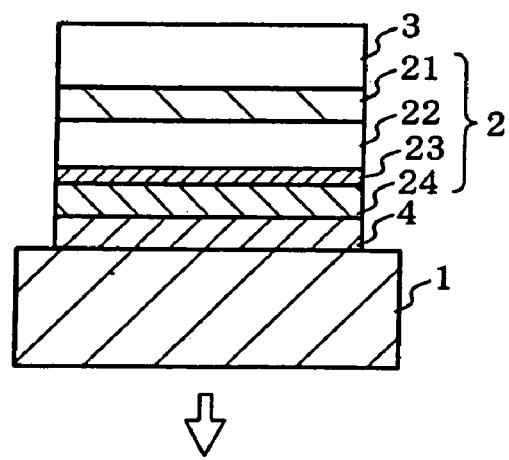
FIG. 4 is a diagram showing yet another embodiment of the blue organic EL display of the invention.

FIG. 1 shows a top-emission type device in which light is taken out from the side opposite to the substrate 1. As shown in FIG. 4, the device may be a bottom-emission type in which light is taken out through the substrate 1. In FIG. 3, the members in the same as FIG. 1 are indicated by the same symbols. In the bottom-emission type device, the protective layer 3 may not necessarily be transparent.

Each member is described below.

1. Reflective Electrode (Reflecting Member/Electrode)

As the material for the reflective electrode, a metal film having low optical transparency is preferable. The reflectance of the metal film is determined by the thickness d, complex refractive index n-iκ, and surface roughness (RMS surface roughness) σ. As the material for the metal film, a material of which both of the real part n and the imaginary part κ (corresponding to the absorption coefficient) of the complex refractive index are small is preferable. As specific examples of such a material, Au, Ag, Cu, Mg, Al, Ni, Pd, and the like can be given.

If the thickness d is small, since light passes through the metal film, the reflectance decreases. It is preferable that the thickness of the metal film be 50 nm or more, although the thickness varies depending on the value of the imaginary part κ of the complex refractive index of the metal used.

If the surface roughness σ is great, light undergoes diffused reflection so that the amount of components reflected in the direction perpendicular to the emission surface of the organic EL device decreases. Therefore, the surface roughness σ is preferably less than 10 nm, and still more preferably less than 5 nm.

2. Reflective Electrode and Semitransparent Electrode (Reflecting Member/Transparent Electrode)

As examples of the reflective electrode and the semitransparent electrode, the following electrodes (1) to (4) can be given.

(1) Metal Electrode (Reflecting Member)

An electrode formed of a metal which reflects light, such as Au, Ag, Al, Pt, Cu, W, Cr, Mn, Mg, Ca, Li, Yb, Eu, Sr, Ba, or Na, or an alloy of two or more metals arbitrarily selected from these metals, such as Mg:Ag, Al:Li, Al:Ca, or Mg:Li, can be given. Of these, a metal or alloy having a work function of 4.0 eV or less is preferable as the cathode, and a metal or alloy having a work function of 4.5 eV or more is preferable as the anode.

(2) Stacked Electrode of Metal Film (Reflecting Member)/Transparent Electrode or Transparent Electrode/Metal Film Since a transparent electrode itself has a low reflectance, the reflectance can be increased by stacking the transparent electrode and a metal film. As the material for the transparent electrode, a conductive oxide is preferable. In particular, ZnO:Al, indium tin oxide (ITO), $SnO_2$:Sb, InZnO, and the like are preferable. As the metal film, a film made of the metal or alloy described in (1) is preferably used. In the stacked electrode, either the transparent electrode or the metal film may be arranged in the side contacting the organic layer.

(3) Stacked Electrode of Dielectric Film (Reflecting Member)/Transparent Electrode or Transparent Electrode/Dielectric Film Since a transparent electrode itself has a low reflectance as described above, the reflectance can be increased by stacking the transparent electrode and a high-refractive-index or low-refractive-index dielectric film. As the high-refractive-index dielectric film, a transparent oxide film or a transparent nitride film having a refractive index of 1.9 or more is preferable. A transparent sulfide film or selenide compound film is also preferable.

As examples of the high-refractive-index dielectric film, films formed of ZnO, $ZrO_2$, $HfO_2$, $TiO_2$, $Si_3N_4$, BN, GaN, GaInN, AlN, $Al_2O_3$, ZnS, ZnSe, ZnSSe, and the like can be given. A film formed by dispersing a powder of such a compound in a polymer may also be used.

As examples of the low-refractive-index dielectric film, a transparent oxide film or a transparent fluoride film having a refractive index of 1.5 or less, a film formed by dispersing a powder of such an oxide or fluoride in a polymer, a fluoropolymer film, and the like can be given. Specific examples include a film formed of $MgF_2$, $CaF_2$, $BaF_2$, NaAlF, SiOF, or the like, a film formed by dispersing a powder of such a compound in a polymer, and a film formed of a fluorinated polyolefin, fluorinated polymethacrylate, fluorinated polyimide, and the like.

(4) Stacked Electrode of Dielectric Multilayer Film (Reflecting Member)/Transparent Electrode or Dielectric Multilayer Film/Metal Electrode The dielectric multilayer film in this stacked electrode is a film formed by alternately stacking the high-refractive-index dielectric film and the low-refractive-index dielectric film described in (3) a number of times. As the transparent electrode, the transparent electrode described in (2) can be given. As the metal film, the metal film described in (1) can be given.

It is preferable that the reflective electrode (reflecting member/electrode) or the reflective electrode and the semitransparent electrode (reflecting member/electrode) have a work function of 4.5 eV or more when used as the anode. As examples of the material for the anode, indium tin oxide (ITO), indium zinc oxide (IZO), tin oxide (NESA), gold, silver, platinum, copper and the like can be given. Of these, indium zinc oxide (IZO) is particularly preferable, since IZO film can be formed at room temperature and is highly amorphous so that separation of the anode hardly occurs. The sheet resistance of the anode is preferably 1000 Ω/square or less.

When using the reflective electrode (reflecting member/electrode) or the reflective electrode and the semitransparent electrode (reflecting member/electrode) as the cathode, an electrode formed of a metal, alloy or electrically conductive compound having a small work function (4 eV or less), or a mixture of these materials is used. As specific examples of such an electrode material, sodium, a sodium-potassium alloy, magnesium, lithium, a magnesium-silver alloy, aluminum/aluminum oxide, an aluminum-lithium alloy, indium, a rare earth metal, and the like can be given. The sheet resistance of the cathode is preferably several hundred Ω/square or less.

In the invention, it is particularly preferable that one of the pair of reflecting members (reflective electrodes) include a multi-layered structure of the high-refractive-index dielectric and the transparent electrode or the dielectric multilayer film. The reflecting member may be formed by using a deposition method or a sputtering method, for example. As examples of the deposition method, a resistance heating method, an electron beam method, and the like can be given. As examples of the sputtering method, a DC sputtering method, an ion beam sputtering method, an electron cyclotron resonance (ECR) method, and the like can be given.

3. Substrate

When the substrate is provided in the light emission path, a substrate having optical transparency is used. As examples of such a substrate, substrates formed of glass, quartz, an organic polymer compound, and the like can be given. Of these, a substrate having a refractive index of 1.6 or less is preferable.

4. Optical Thickness Adjusting Layer

The optical thickness adjusting layer is a layer which adjusts the optical thickness between the two reflecting members and is made of a substance transparent to visible light (having a visible light transmittance of 50% or more, and preferably 80% or more)

The material used for the optical thickness adjusting layer is not particularly limited insofar as the material is transparent. For example, an inorganic oxide is preferable. As specific examples of the inorganic oxide, oxides of In, Sn, Zn, Ce, Sm, Pr, Nd, Tb, Cd, Al, Mo, W, and the like can be given. Of these, an oxide containing In, Sn, Zn, or Ce is preferable.

5. Organic Layer

The organic layer arranged between the pair of reflecting members includes at least an emitting layer. The following configurations can be given as examples of the configuration from the reflective electrode as the anode to the reflective electrode as the cathode.

(1) Hole injecting layer/emitting layer
(2) Hole transporting layer/emitting layer
(3) Emitting layer/electron injecting layer
(4) Hole injecting layer/emitting layer/electron injecting layer
(5) Hole transporting layer/emitting layer/electron injecting layer
(6) Hole injecting layer/hole transporting layer/emitting layer/electron injecting layer
(7) Hole injecting layer/emitting layer/hole blocking layer/electron injecting layer
(8) Hole injecting layer/emitting layer/electron injecting layer/adhesion improving layer
(9) Hole transporting layer/emitting layer/adhesion improving layer
(10) Hole injecting layer/electron blocking layer/emitting layer/electron injecting layer Of these configurations, the "hole transporting layer/emitting layer" configuration, the "hole transporting layer/emitting layer/electron injecting layer" configuration, and the "hole transporting layer/emitting layer/adhesion improving layer" configuration are preferable. The organic layer may include an inorganic compound layer, if necessary.

The emitting layer described above can be formed by a known method such as vapor deposition, spin coating, casting process or LB technique. In particular, the emitting layer is preferably a molecule-deposited film. The molecule-deposited film is a thin film formed by precipitation and deposition from a compound for the emitting layer in a gas phase state or a film formed by solidification from the compound in a molten state or a liquid phase state. This molecule-deposited film can be usually distinguished from the thin film formed by LB technique (the molecule-accumulated film) by difference in aggregation structure or high-order structure, or in functional difference resulting therefrom. The emitting layer can be formed by dissolving a compound for the emitting layer together with a binder, such as resin into a solvent to prepare a solution and then making this into a thin film by spin coating or the like.

The emitting layer is formed by doping an organic luminescent medium (dopant) in a host material. The host material and the dopant may each be selected from known materials. For example, it is preferred to use, as the host material, a material represented by a general formula (1):

$$(Ar^1)_l \text{—} (X)_m \tag{1}$$

wherein $Ar^1$ is an aromatic ring with 6 to 50 nucleus carbon atoms, X is a substituent, l is an integer of 1 to 5, and m is an integer of 0 to 6.

Specific examples of $Ar^1$ include phenyl, naphthyl, anthracene, biphenylene, azulene, acenaphthylene, fluorene, phenanthrene, fluoranthene, acephenanthrylene, triphenylene, pyrene, chrysene, naphthacene, picene, perylene, penthaphene, pentacene, tetraphenylene, hexaphene, hexacene, rubicene, coronene, and trinaphthylene rigns.

Specific examples of X include substituted or unsubstituted aromatic groups with 6 to 50 nucleus carbon atoms, substituted or unsubstituted aromatic heterocyclic groups with 5 to 50 nucleus carbon atoms, substituted or unsubstituted alkyl groups with 1 to 50 carbon atoms, substituted or unsubstituted alkoxy groups with 1 to 50 carbon atoms, substituted or unsubstituted aralkyl groups with 1 to 50 carbon atoms, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbon atoms, substituted or unsubstituted styryl groups, halogen groups, a cyano group, a nitro group, and a hydroxyl group.

l of $Ar^1$s may be the same as or different from each other when l is 2 or more, and m of Xs may be the same as or different from each other when m is 2 or more.

It is preferred to use, as the first organic luminescent medium emitting blue light and the second organic luminescent medium emitting second light, a material represented by a general formula (2):

wherein $Ar^2$ to $Ar^4$ are each a substituted or unsubstituted aromatic group with 6 to 50 nucleus carbon atoms, or a substituted or unsubstituted styryl group, and p is an integer of 1 to 4.

Examples of the substituted or unsubstituted aromatic group with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Examples of the substituted or unsubstituted styryl group include 2-phenyl-1-vinyl, 2,2-diphenyl-1-vinyl, and 1,2,2-triphenyl-1-vinyl groups.

p is an integer of 1 to 4.

p of $Ar^3$s, as well as p of $Ar^4$s, may be the same as or different from each other, respectively, when p is 2 or more.

Next, the hole transporting layer is not essential, but it is preferably used to improve a luminous performance. Such a hole transporting layer is preferably made of a material which can transport holes to the emitting layer at a lower electric field intensity. The hole mobility thereof is preferably at least $10^{-6}$ cm$^2$/V·second when an electric field of, e.g., $10^4$ to $10^6$ V/cm is applied. The material for forming the hole transporting layer is not particularly limited so long as the material has the above-mentioned preferred natures. The material can be arbitrarily selected from materials which have been widely used as a hole transporting material in photoconductive materials and known materials used in a hole transporting layer of organic EL devices.

The hole transporting layer can be formed by making the hole-transporting material into a thin film by a known method, such as vacuum deposition, spin coating, casting or LB technique.

The thickness of the hole transporting layer is not particularly limited, and is usually from 5 nm to 5 μm. This hole transporting layer may be a single layer made of one or more out of the hole-transporting materials. A hole transporting layer made of a material different from that in another hole transporting layer may be stacked thereon.

Between the emitting layer and the anode, an electron blocking layer may be formed to keep electrons in the emitting layer.

The electron injecting layer, which is made of electron injecting materials, has a function for transporting electrons injected from the cathode to the emitting layer. The electron injecting material is not particularly limited. The material can be arbitrarily selected from compounds which have been widely known.

The electron injecting layer can be formed by making the electron injecting material into a thin film by a known method, such as vacuum deposition, spin coating, casting or LB technique.

The thickness of the electron injecting layer is usually from 5 nm to 5 μm. This electron injecting layer may be a single layer made of one or more out of the electron-injecting materials. Alternatively, it may be constituted by stacking plural electron injecting layers each made of a material different from each other.

The adhesion improving layer preferably comprises a material good in electron-transmittance, and adhesion to an emitting layer and the cathode. Specific examples of such materials include metal complexes of 8-hydroxyquinoline or derivative such as metal chelate oxynoid compounds each containing a chelate of oxine (generally, 8-quinolinol or 8-hydroxyquinoline). Specifically, examples thereof include tris(8-quinolinol)aluminum, tris(5,7-dichloro-8-quinolinol) aluminum, tris(5,7-dibromo-8-quinolinol)aluminum and tris (2-methyl-8-quinolinol)aluminum, and complexes thereof with ligands such as indium, magnesium, copper, gallium, tin and lead instead of aluminum.

6. Color Adjusting Layer

The color adjusting layer includes a color conversion (changing) member and/or a color filter.

The color conversion member (fluorescence conversion film) is arranged outside the light-emission-side reflective electrode in order to change the color of the light emitted from the organic layer and having a center wavelength of λ. The color conversion member is formed of a fluorescent material.

As the material for the fluorescence conversion film, an inorganic fluorescent material and an organic fluorescent material can be given. In particular, a material prepared by dispersing an organic fluorescent substance in a polymer is preferable. As the organic fluorescent substance, coumarins, rhodamines, fluoresceines, cyanines, porphyrins, naphthalimides, perylenes, quinacridons, and the like are preferable due to their high fluorescence quantum yield. A substance having a fluorescence quantum yield of 0.3 or more in a state in which the substance is dispersed in a polymer binder is particularly preferable. The organic fluorescent substance may be used either individually or in combination of two or more. As the polymer binder, a transparent resin such as polymethacrylate, polycarbonate, polyvinyl chloride, polyimide, polyamic acid, polyolefin, or polystyrene is preferably used.

The fluorescence conversion film may be formed by using various methods without specific limitations. For example, the fluorescence conversion film is obtained by dispersing the organic fluorescent substance in the polymer binder and forming the mixture into a film having a thickness of 500 to 50000 nm, and preferably 1000 to 5000 nm using a method such as a casting method, a spin coating method, a printing method, a bar coating method, an extrusion forming method, a roll forming method, a pressing method, a spraying method, or a roll coating method. When using an organic solvent in the above film formation method, dichloromethane, 1,2-dichloroethane, chloroform, acetone, cyclohexanone, toluene, benzene, xylene, N,N-dimethylformamide, dimethylsulfoxide, 1,2-dimethoxyethane, diethylene glycol dimethyl ether, and the like may be used as the organic solvent. These solvents may be used either individually or in combination of two or more.

A color filter may be used for adjusting color purity, as required. Examples of materials for the color filter include dyes or solid objects in which the same dye is dissolved or dispersed in a binder resin. Examples of the dye include copper phthalocyanine dyes, indanthrone dyes, indophenol dyes, cyanine dyes and dioxazin dyes. The dye is possible to use only one or a mixture of at least two or more kinds. Examples of the binder resin of the dye include transparent resins (polymers) such as polymethyl methacrylate, polyacrylate, polycarbonate, polyvinyl alcohol, polyvinyl pyrrolidone, hydroxyethylcellulose, and carboxymethylcellulose. It can be used alone or as a mixture of two or more thereof. It is preferred to use, as the binder resin, a photosensitive resin to which photolithography can be applied. Examples thereof are photo-setting resist materials having reactive vinyl groups such as acrylic acid type, methacrylic acid type, polyvinyl cinnamate type and cyclic rubber type. The photosensitive resin can be used alone or as a mixture of two or more kinds.

EXAMPLES

Example 1

[Fabrication of Organic EL Device]

A glass substrate, 25 mm×75 mm×1.1 mm thick (Corning 7059) was subjected to ultrasonic cleaning in isopropyl alcohol for 5 minutes followed by UV ozone cleaning for 30 minutes. The washed glass substrate was set up on a substrate holder in a vacuum deposition device.

Aluminum was sputtered to form a 300 nm thick film on the grass substrate. This aluminum film functioned as an anode and a first reflective member. ITO was sputtered to form a 5 nm thick film on the aluminum film. This ITO film functioned as a hole injecting electrode.

Next, a layer comprising the compound HI described below (hereinafter referred to as HI film) having a thickness of 25 nm was formed on the ITO film. This HI film functioned as a hole injecting layer. A layer comprising the compound HT described below (hereinafter referred to as HT film) having a thickness of 10 nm was formed on the HI film. This HT film functioned as a hole transporting layer.

Furthermore, the compound BH described below as a host material, and the compound BD described below as a dopant material having a luminescent peak of 452 nm and an Eg of 2.81 eV were co-deposited on the HT film such that the thickness ratio of BH to BD was 10 to 0.5, to form a first emitting layer (blue emitting layer) having a thickness of 10 nm. Furthermore the compound BH described below as a host material and the compound RD described below as a dopant material having a luminescent peak of 588 nm and an Eg of 2.36 eV were co-deposited such that the thickness ratio of BH to RD was 30 to 0.6, to form a second emitting layer (orange emitting layer) having a thickness of 30 nm.

A tris(8-quinolinol)aluminum film (hereinafter referred to as Alq film) was formed in a thickness of 10 nm thereon. This Alq film functioned as an electron transporting layer. LiF was deposited on the Alq film in a thickness of 1 nm to form an electron-injecting cathode. Furthermore, an alloy film that comprised magnesium and silver in the ratio of magnesium to silver of 9 to 1 (hereinafter referred to as Mg:Ag film) was formed in a thickness of 10 nm. This Mg:Ag film functioned as a metal cathode and a second reflective member. To form an upper transparent electrode, IZO was sputtered in a thickness of 90 nm. Finally as a sealing layer which covers the entire of the organic EL emitting parts, $SiO_xN_y$ (O/O+N=50%: atomic ratio) was deposited by low temperature CVD to form a 300 nm-thick transparent inorganic film on the upper electrode of the organic EL device. An organic EL device was thus obtained.

[Evaluation of Initial Performance of Organic EL Device]

Figure 5:
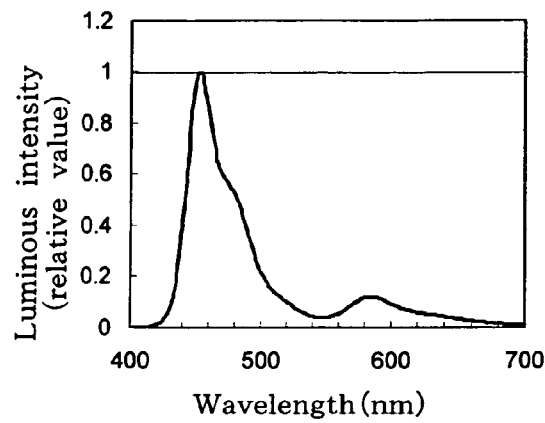
FIG. 5 is a diagram showing a luminescent spectrum of Example 1.

A current was applied to the organic EL device thus obtained at a current density of 10 mA/cm$^2$. The luminescent spectrum thereof was measured with a spectral radiance luminance meter (CS-1000, manufactured by Minolta Co., Ltd.) and shown in FIG. 5. The intensity ratio $I_1/I_2$ was 8.4 wherein $I_1$ was the intensity at the blue first peak wavelength (452 nm) and $I_2$ was the intensity at the orange second peak wavelength (588 nm). The chromaticity was (0.195, 0.139), the luminance was 565 nit, and high luminance blue emission was observed.

[Evaluation of Lifetime of Organic EL Device Under Continuous Driving]

A constant current continuous driving test was conducted at room temperature while a current value was adjusted such that a luminance of the organic EL device thus obtained was 1000 nit. A period of time until the luminance reduced by half (lifetime) was 5980 hours.

Example 2

[Fabrication of Organic EL Device]

An organic EL device was fabricated in the same manner as in Example 1 except that the compound BH as a host material, and the compound RD as a dopant having a luminescent peak of 588 nm were co-deposited such that the thickness ratio of BH to RD was 30 to 0.3, to form a second emitting layer (orange emitting layer) having a thickness of 30 nm.

[Evaluation of Initial Performance of Organic EL Device]

Figure 6:
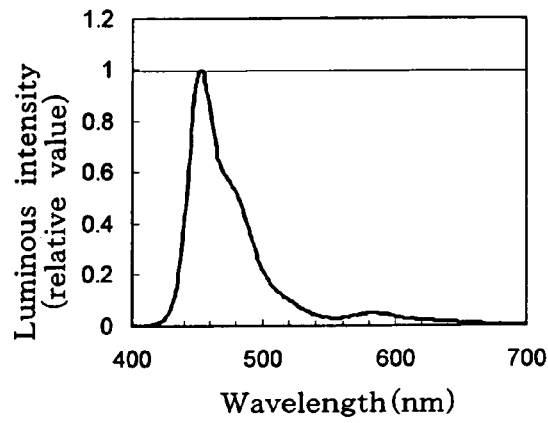
FIG. 6 is a diagram showing a luminescent spectrum of Example 2.

A current was applied to the organic EL device thus obtained at a current density of 10 mA/cm$^2$. The luminescent spectrum thereof was measured with a spectral radiance luminance meter (CS-1000, manufactured by Minolta Co., Ltd.) and shown in FIG. 6. The ratio $I_1/I_2$ was 20.8 wherein $I_1$ was the intensity at the blue first peak wavelength (452 nm) and $I_2$ was the intensity at the orange second peak wavelength (588 nm). The chromaticity was (0.163, 0.114), the luminance was 567 nit, and high luminance blue emission was observed.

[Evaluation of Lifetime of Organic EL Device Under Continuous Driving]

A constant current continuous driving test was conducted at room temperature while a current value was adjusted such that a luminance of the organic EL device thus obtained was 1000 nit. A period of time until the luminance reduced by half (lifetime) was 6010 hours.

Comparative Example 1

[Fabrication of Organic EL Device]

An organic EL device was fabricated in the same manner as in Example 1 except that the compound BH as a host material, and the compound BD as a dopant having a luminescent peak of 452 nm were co-deposited such that the thickness ratio of BH to BD was 40 to 2.0, to form only a first emitting layer (blue emitting layer) having a thickness of 40 nm and no second emitting layer (orange emitting layer) was formed.

[Evaluation of Initial Performance of Organic EL Device]

Figure 7:
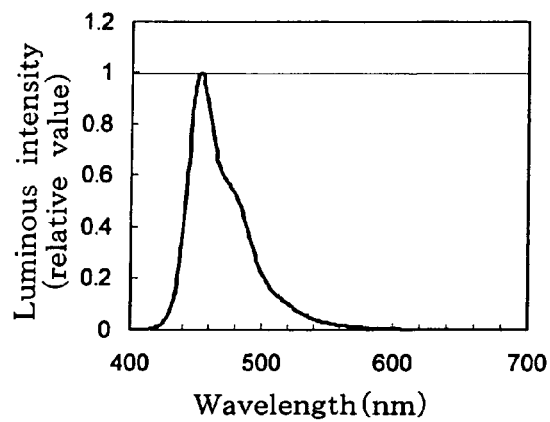
FIG. 7 is a diagram showing a luminescent spectrum of Comparative Example 1.

A current was applied to the organic EL device thus obtained at the current density of 10 mA/cm$^2$. The luminescent spectrum thereof was measured with a spectral radiance luminance meter (CS-1000, manufactured by Minolta Co., Ltd.) and shown in FIG. 7. The ratio $I_1/I_2$ was 177 wherein $I_1$ was the intensity at the blue first peak wavelength (452 nm) and $I_2$ was the intensity at the orange second peak wavelength (588 nm). The chromaticity was (0.141, 0.097), the luminance was 570 nit, and high luminance blue emission in the same extent as the examples was observed.

[Evaluation of Lifetime of Organic EL Device Under Continuous Driving]

A constant current continuous driving test was conducted at room temperature while a current value was adjusted such that a luminance of the organic EL device thus obtained was 1000 nit. A period of time until the luminance was reduced by half (lifetime) was 4410 hours. and this lifetime was only about 70% of those of the examples.

Comparative Example 2

[Fabrication of Organic EL Device]

An organic EL device was fabricated in the same manner as in Example 2 except that ITO was sputtered to form a film in a thickness of 110 nm after an aluminum film of a first reflective member was formed. The ITO film functioned as a hole injecting electrode and also functioned as an optical-film-thickness-adjusting layer which adjusted the optical thickness between the first reflective member and the second reflective member.

[Evaluation of Initial Performance of Organic EL Device]

Figure 8:
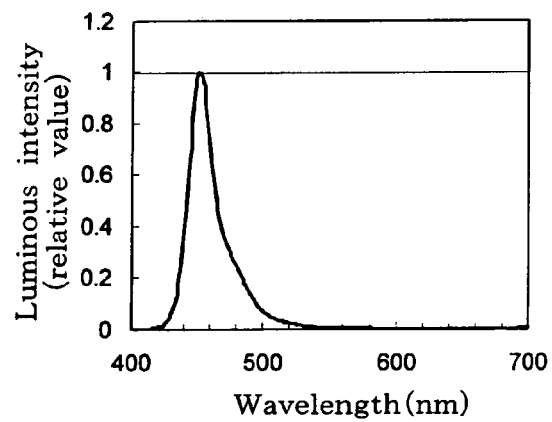
FIG. 8 is a diagram showing a luminescent spectrum of Comparative Example 2.

A current was applied to the organic EL device thus obtained at a current density of 10 mA/cm$^2$. The luminescent spectrum thereof was measured with a spectral radiance luminance meter (CS-1000, manufactured by Minolta Co., Ltd.) and shown in FIG. 8. The ratio $I_1/I_2$ was 492 wherein $I_1$ was the intensity at the blue first peak wavelength (452 nm) and $I_2$ was the intensity at a wavelength of 588 nm. The chromaticity was (0.146, 0.052), and the luminance was 185 nit. Although the chromaticity came to a deep blue in compared with those of the examples, the luminance was only about 30% of those of the examples.

[Evaluation of Lifetime of Organic EL Device Under Continuous Driving]

A constant current continuous driving test was conducted at room temperature while a current value was adjusted such that a luminance of the organic EL device thus obtained was 1000 nit. A period of time until the luminance reduced by half (lifetime) was 1570 hours, and this lifetime was only about 30% of those of the examples.

Comparative Example 3

[Fabrication of Organic EL Device]

An organic EL device was fabricated in the same manner as in Example 1 except that the compound BH as a host material, and the compound RD as a dopant having a luminescent peak of 588 nm were co-deposited such that the thickness ratio of BH to BD was 30 to 0.9, to form a second emitting layer (orange emitting layer) having a thickness of 30 nm.

[Evaluation of Initial Performance of Organic EL Device]

Figure 9:
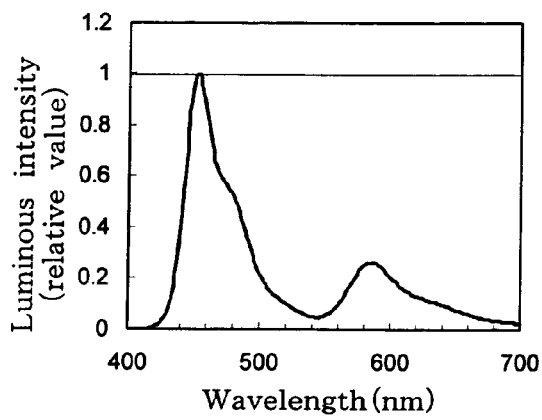
FIG. 9 is a diagram showing a luminescent spectrum of Comparative Example 3.

A current was applied to the organic EL device thus obtained at the current density of 10 mA/cm$^2$. The luminescent spectrum thereof was measured with a spectral radiance luminance meter (CS-1000, manufactured by Minolta Co., Ltd.) and shown in FIG. 9. The ratio $I_1/I_2$ was 3.8 wherein $I_1$ was the intensity at the blue first peak wavelength (452 nm) and $I_2$ was the intensity at a wavelength of 588 nm. The chromaticity was (0.245, 0.180) and the luminance was 562 nit. The chromaticity in blue became worse in comparison with the examples.

[Evaluation of Lifetime of Organic EL Device Under Continuous Driving]

A constant current continuous driving test was conducted at room temperature while a current value was adjusted such that a luminance of the organic EL device thus obtained was 1000 nit. A period of time until the luminance reduced by half (lifetime) was 5940 hours and the organic EL device had a lifetime in the same extent as those of the examples.

Comparative Example 4

[Fabrication of Organic EL Device]

For comparing with example 1, an organic EL device having only one reflective member was fabricated.

ITO was sputtered to form a 130 nm thick film on a glass substrate having a size of 25 mm×75 mm×1.1 mm in thickness (Corning 7059). The ITO film functioned as a hole injecting electrode. The glass substrate with the ITO film was subjected to ultrasonic cleaning with isopropyl alcohol for 5 minutes, followed by UV ozone cleaning for 30 minutes. The glass substrate thus washed was set up on a substrate holder in a vacuum deposition device.

A HI film was formed on the ITO film in a thickness of 60 nm. A HT film was formed on the HI film in a thickness of 20 nm. Further, the compound BH as a host material, and the compound BD as a dopant material having a luminescent peak of 452 nm were co-deposited on the HT film such that the thickness ratio of BH to BD was 10 to 0.5, to form a first emitting layer (blue emitting layer) having a thickness of 10 nm. Furthermore, the compound BH as a host material and the compound RD as a dopant material having a luminescent peak of 588 nm were co-deposited such that the thickness ratio of BH to BD was 30 to 0.6, to form a second emitting layer (orange emitting layer) having a thickness of 30 nm.

A tris(8-quinolinol) aluminum film (hereinafter referred to as Alq film) was formed in a thickness of 20 nm thereon. LiF was deposited on the Alq film in a thickness of 1 nm to form an electron-injecting cathode. Further, an aluminum film was formed thereon in a thickness of 150 nm to obtain an organic EL device.

(Evaluation of Initial Performance of Organic EL Device)

Figure 10:
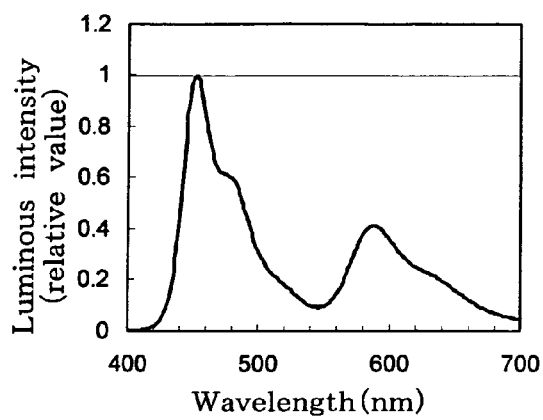
FIG. 10 is a diagram showing a luminescent spectrum of Comparative Example 4.

A current was applied to the organic EL device thus obtained at the current density of 10 mA/cm$^2$, and the luminescent spectrum thereof was measured with a spectral radiance luminance meter ("CS1000" manufactured by Minolta Co., Ltd.) to obtain the luminescent spectrum shown in FIG. 10. The ratio $I_1/I_2$ of the luminous intensity $I_1$ at the blue first peak wavelength (452 nm) to the luminous intensity $I_2$ at 588 nm was 2.4. The chromaticity was (0.284, 0.224) and the luminance was 815 nit. The blue chromaticity became worse in comparison with the examples.

The results are summarized in Table 1. When the ratio $I_1/I_2$ of the intensity $I_1$ at the blue first peak wavelength to the intensity $I_2$ at the second peak wavelength was less than five, the blue chromaticity became worse. When the ratio $I_1/I_2$ exceeded 100, the luminance half-decay lifetime during continuous driving was decreased. Specifically, it was confirmed that a blue organic EL device exhibiting a high blue purity and having a long lifetime can be realized by adjusting the ratio $I_1/I_2$ within an appropriate range.

Table 2 shows the optical length, phase shift, and m-value of the organic EL device of each example.

TABLE 1

| | $I_1/I_2$ | CIEx | CIEy | Luminance [nit] | Lifetime [hr] |
|---|---|---|---|---|---|
| Example 1 | 8.4 | 0.195 | 0.139 | 565 | 5980 |
| Example 2 | 20.8 | 0.163 | 0.114 | 567 | 6010 |
| Comparative Example 1 | 177 | 0.141 | 0.097 | 570 | 4410 |
| Comparative Example 2 | 492 | 0.146 | 0.052 | 185 | 1570 |
| Comparative Example 3 | 3.8 | 0.245 | 0.180 | 562 | 5940 |
| Comparative Example 4 | 2.4 | 0.284 | 0.224 | 815 | — |

TABLE 2

| | First peak wavelength (452 nm) | | | Second peak wavelength (588 nm) | | |
|---|---|---|---|---|---|---|
| | Optical length [nm] | Phase shift [radian] | m value | Optical length [nm] | Phase shift [radian] | m value |
| Example 1 | 171 | −4.79 | 0 | 157 | −4.52 | −0.2 |
| Example 2 | 171 | −4.79 | 0 | 157 | −4.52 | −0.2 |
| Comparative Example 1 | 171 | −4.79 | 0 | 157 | −4.52 | −0.2 |
| Comparative Example 2 | 377 | −4.79 | 0.9 | 348 | −4.52 | 0.5 |
| Comparative Example 3 | 171 | −4.79 | 0 | 157 | −4.52 | −0.2 |

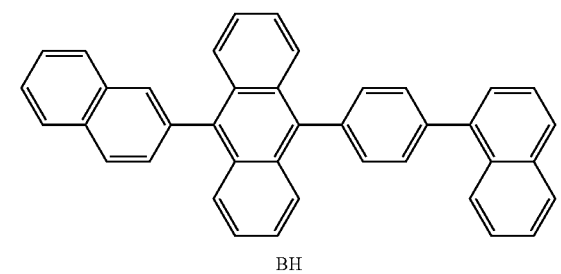

BH

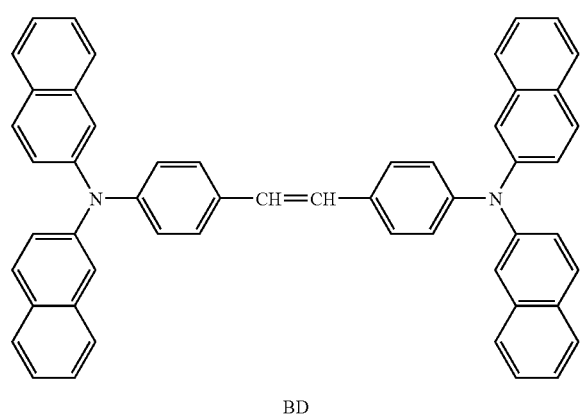

BD

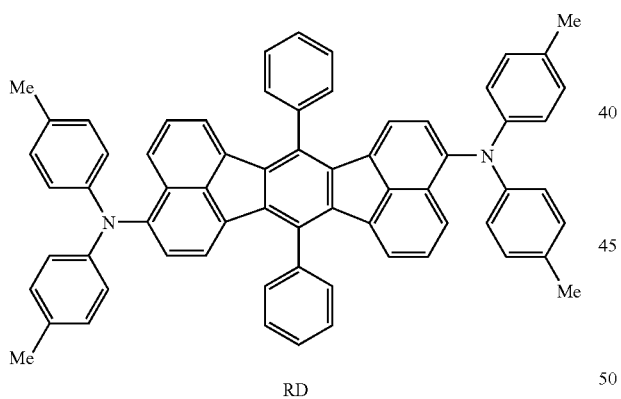

RD

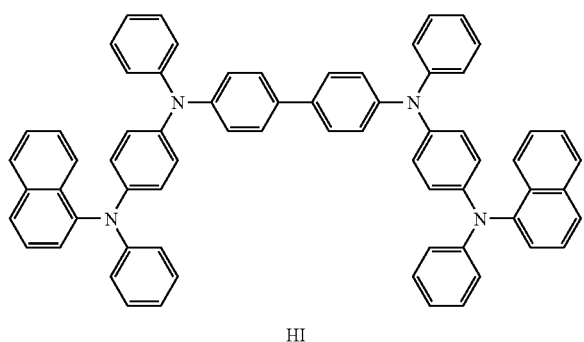

HI

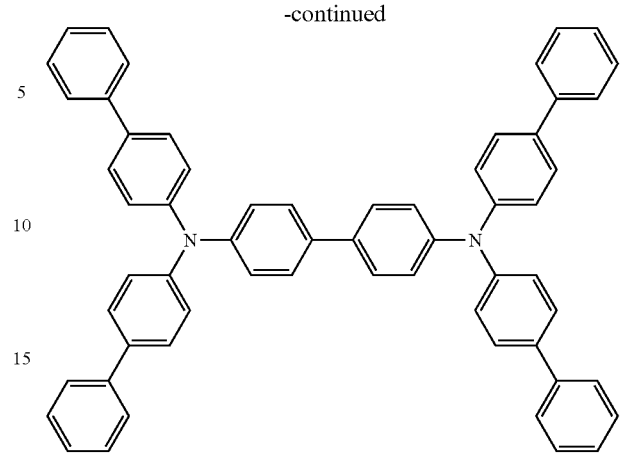

HT

INDUSTRIAL APPLICABILITY

The blue organic EL device of the invention can be used for various kinds of displays such as consumer TVs, large displays and displays for cellular phones.

What is claimed is:

1. A blue organic electroluminescent device comprising:
   a first reflective member,
   a second reflective member and
   an emitting layer arranged between the first and the second reflective members;
   wherein the emitting layer comprises a first organic luminescent medium emitting light with a blue first peak wavelength and a second medium emitting light with a second peak wavelength;
   each of lights emitted from the first and second organic luminescent mediums are interfered with between the first and second reflective members to enhance the light emitted from the first organic luminescent medium; and
   light taken out to outside has a first peak wavelength and a second peak wavelength that satisfy the following relationship:

$$I1 > I2 \times 5, I1 < I2 \times 100$$

wherein I1 is a luminous intensity at the first peak wavelength and I2 is a luminous intensity at the second peak wavelength.

2. The blue organic electroluminescent device according to claim 1 wherein the first peak wavelength is ranged from 400 nm to 500 nm, and the second peak wavelength is ranged from 500 nm to 700 nm.

3. The blue organic electroluminescent device according to claim 1 wherein an energy gap Eg1 of the first organic luminescent medium and an energy gap Eg2 of the second organic luminescent medium satisfies the relationship of Eg1>Eg2.

4. The blue organic electroluminescent device according to claim 1 which satisfies the relationship represented by the following equation:

$$(2L)/\lambda + \Phi/(2\pi) = m$$

wherein L is the optical length between the first and the second reflective members, $\lambda$ is the blue first peak wavelength, $\Phi$ is the sum of phase shifts at the interfaces between the two reflective members, and m is an integer of 0 or more or a value around the integer.

5. The blue organic electroluminescent device according to claim 1 wherein the emitting layer is a multi-layered structure of a first layer comprising the first organic luminescent medium and a second layer comprising the second organic luminescent medium.

6. An organic electroluminescent display comprising;
the blue organic electroluminescent device according to claim 1; and
a color adjusting member that adjusts color of light emitted from the blue organic electroluminescent device.

7. An organic electroluminescent display comprising;
the blue organic electroluminescent device according to claim 2; and
a color adjusting member that adjusts color of light emitted from the blue organic electroluminescent device.

8. An organic electroluminescent display comprising;
the blue organic electroluminescent device according to claim 3; and
a color adjusting member that adjusts color of light emitted from the blue organic electroluminescent device.

9. An organic electroluminescent display comprising;
the blue organic electroluminescent device according to claim 4; and
a color adjusting member that adjusts color of light emitted from the blue organic electroluminescent device.

10. An organic electroluminescent display comprising;
the blue organic electroluminescent device according to claim 5; and
a color adjusting member that adjusts color of light emitted from the blue organic electroluminescent device.

11. An organic electroluminescent display comprising in sequence;
a substrate;
the blue organic electroluminescent device according to claim 1; and
a color adjusting member that adjusts color of light emitted from the blue organic electroluminescent device.

12. An organic electroluminescent display comprising in sequence;
a substrate;
the blue organic electroluminescent device according to claim 2; and
a color adjusting member that adjusts color of light emitted from the blue organic electroluminescent device.

13. An organic electroluminescent display comprising in sequence;
a substrate;
the blue organic electroluminescent device according to claim 3; and
a color adjusting member that adjusts color of light emitted from the blue organic electroluminescent device.

14. An organic electroluminescent display comprising in sequence;
a substrate;
the blue organic electroluminescent device according to claim 4; and
a color adjusting member that adjusts color of light emitted from the blue organic electroluminescent device.

15. An organic electroluminescent display comprising in sequence;
a substrate;
the blue organic electroluminescent device according to claim 5; and
a color adjusting member that adjusts color of light emitted from the blue organic electroluminescent device.

* * * * *